US011946132B2

(12) United States Patent
Pinter

(10) Patent No.: US 11,946,132 B2
(45) Date of Patent: Apr. 2, 2024

(54) CHALCOGENIDE SPUTTERING TARGET AND METHOD OF MAKING THE SAME

(71) Applicant: Honeywell International Inc., Morris Plains, NJ (US)

(72) Inventor: Michael R. Pinter, Spokane, WA (US)

(73) Assignee: Honeywell International Inc., Charlotte, NC (US)

( * ) Notice: Subject to any disclaimer, the term of this patent is extended or adjusted under 35 U.S.C. 154(b) by 492 days.

(21) Appl. No.: 17/114,216

(22) Filed: Dec. 7, 2020

(65) Prior Publication Data

US 2021/0095370 A1  Apr. 1, 2021

Related U.S. Application Data

(62) Division of application No. 15/670,487, filed on Aug. 7, 2017, now Pat. No. 10,889,887.

(60) Provisional application No. 62/378,031, filed on Aug. 22, 2016.

(51) Int. Cl.
| | |
|---|---|
| *C23C 14/34* | (2006.01) |
| *C04B 35/547* | (2006.01) |
| *C04B 35/653* | (2006.01) |
| *C22C 1/00* | (2023.01) |
| *C23C 14/06* | (2006.01) |
| *H01J 37/34* | (2006.01) |

(52) U.S. Cl.
CPC ........ *C23C 14/3407* (2013.01); *C04B 35/547* (2013.01); *C04B 35/653* (2013.01); *C22C 1/00* (2013.01); *C23C 14/0623* (2013.01); *C23C 14/3414* (2013.01); *H01J 37/3426* (2013.01); *H01J 37/3429* (2013.01)

(58) Field of Classification Search
None
See application file for complete search history.

(56) References Cited

U.S. PATENT DOCUMENTS

| | | | |
|---|---|---|---|
| 5,843,391 | A | 12/1998 | Yamamoto et al. |
| 5,958,103 | A | 9/1999 | Yoneda et al. |
| 6,015,765 | A | 1/2000 | Harbison et al. |
| 6,074,968 | A | 6/2000 | Yoneda et al. |

(Continued)

FOREIGN PATENT DOCUMENTS

| | | |
|---|---|---|
| CN | 1547623 A | 11/2004 |
| CN | 1825649 A | 8/2006 |

(Continued)

OTHER PUBLICATIONS

Chen, Shiyu; et al. "Sb7Te3/Ge Multilayer Films for Low Power and High Speed Phase-Change Memory." IOP Publishing, Semicond. Sci. Technol., 32 065003, pp. 1-8, 2017.

(Continued)

*Primary Examiner* — Jason Berman
(74) *Attorney, Agent, or Firm* — Faegre Drinker Biddle & Reath LLP

(57) ABSTRACT

In one embodiment, a physical vapor deposition device includes a phase change material sputtering target includes a primary matrix and at least one additional phase. The primary matrix includes at least one element from Group VI of the periodic table excluding oxygen and one or more elements from Group IV or Group V of the periodic table. The additional phase is substantially homogenously dispersed in the primary matrix.

20 Claims, 7 Drawing Sheets

(56) References Cited

U.S. PATENT DOCUMENTS

| | | |
|---|---|---|
| 6,503,859 B1 | 1/2003 | Aitken |
| 6,576,291 B2 | 6/2003 | Bawendi et al. |
| 6,756,333 B2 | 6/2004 | Aitken |
| 6,821,337 B2 | 11/2004 | Bawendi et al. |
| 6,874,335 B2 | 4/2005 | Uhlenbrock |
| 6,984,598 B1 | 1/2006 | Hilton, II |
| 7,138,098 B2 | 11/2006 | Bawendi et al. |
| 7,156,964 B2 | 1/2007 | Yahagi et al. |
| 7,157,390 B1 | 1/2007 | Hilton, II |
| 7,418,835 B2 | 9/2008 | Nguyen et al. |
| 7,693,388 B1 | 4/2010 | Nguyen et al. |
| 7,767,604 B2 | 8/2010 | Aitken |
| 7,807,595 B2 | 10/2010 | Nguyen et al. |
| 7,829,059 B2 | 11/2010 | Guo et al. |
| 7,844,162 B2 | 11/2010 | Nguyen et al. |
| 7,891,215 B2 | 2/2011 | Nguyen et al. |
| 8,148,707 B2 | 4/2012 | Ovshinsky et al. |
| 8,193,027 B2 | 6/2012 | Xiao et al. |
| 8,206,804 B2 | 6/2012 | Aitken et al. |
| 8,277,677 B2 | 10/2012 | Kanatzidis et al. |
| 8,299,349 B2 | 10/2012 | Rhyee et al. |
| 8,524,362 B2 | 9/2013 | Ramanath et al. |
| 8,563,353 B2 | 10/2013 | Xiao et al. |
| 8,574,346 B2 | 11/2013 | Monereau et al. |
| 8,882,975 B2 * | 11/2014 | Yahagi ............... C23C 14/3414 420/576 |
| 9,034,688 B2 | 5/2015 | Chen et al. |
| 9,209,374 B2 | 12/2015 | Peng et al. |
| 9,359,202 B2 | 6/2016 | Gresty et al. |
| 9,379,321 B1 | 6/2016 | Chang et al. |
| 9,496,491 B2 | 11/2016 | Marsh et al. |
| 9,573,809 B2 | 2/2017 | Carter |
| 2002/0071952 A1 | 6/2002 | Bawendi et al. |
| 2002/0100683 A1 | 8/2002 | Mohan et al. |
| 2003/0168333 A1 | 9/2003 | Schlott et al. |
| 2003/0209105 A1 | 11/2003 | Bawendi et al. |
| 2004/0040837 A1 | 3/2004 | Mcteer et al. |
| 2005/0031484 A1 | 2/2005 | Nonaka et al. |
| 2006/0185771 A1 * | 8/2006 | Inoue ............... C22C 9/00 148/403 |
| 2007/0007505 A1 | 1/2007 | Rastogi et al. |
| 2007/0099332 A1 | 5/2007 | Kardokus et al. |
| 2008/0112878 A1 | 5/2008 | Kardokus et al. |
| 2008/0287278 A1 | 11/2008 | Nguyen et al. |
| 2009/0107834 A1 | 4/2009 | Ye et al. |
| 2009/0301872 A1 | 12/2009 | Yahagi et al. |
| 2010/0064731 A1 | 3/2010 | Nguyen et al. |
| 2010/0067862 A1 | 3/2010 | Nguyen et al. |
| 2010/0206724 A1 | 8/2010 | Takahashi |
| 2011/0017580 A1 | 1/2011 | Ozaki et al. |
| 2012/0034767 A1 | 2/2012 | Xiao et al. |
| 2012/0220076 A1 | 8/2012 | Xiao et al. |
| 2012/0279857 A1 | 11/2012 | Takahashi et al. |
| 2013/0001078 A1 | 1/2013 | Zhang et al. |
| 2013/0126346 A1 | 5/2013 | Bartholomeusz et al. |
| 2013/0168241 A1 * | 7/2013 | Tamura ............... C23C 14/3414 204/298.13 |
| 2014/0000315 A1 | 1/2014 | Calvez et al. |
| 2014/0024173 A1 | 1/2014 | Xiao et al. |
| 2014/0255604 A1 | 9/2014 | Hens et al. |
| 2015/0225254 A1 | 8/2015 | Zhang et al. |
| 2015/0344342 A1 | 12/2015 | Nguyen et al. |
| 2016/0233373 A1 | 8/2016 | Gresty et al. |
| 2017/0040533 A1 | 2/2017 | Marsh et al. |
| 2017/0084833 A1 | 3/2017 | Zanderighi et al. |
| 2018/0044761 A1 | 2/2018 | Mitchell et al. |
| 2018/0051370 A1 | 2/2018 | Pinter |

FOREIGN PATENT DOCUMENTS

| | | |
|---|---|---|
| CN | 101042903 A | 9/2007 |
| CN | 101299454 A | 11/2008 |
| CN | 101512037 A | 8/2009 |
| CN | 102753721 A | 10/2012 |
| CN | 102086030 B | 3/2013 |
| CN | 103320749 A | 9/2013 |
| CN | 103320750 B | 4/2015 |
| CN | 104843996 A | 8/2015 |
| CN | 104926119 A | 9/2015 |
| CN | 103232161 B | 11/2015 |
| CN | 103979792 B | 1/2016 |
| CN | 105541111 A | 5/2016 |
| CN | 106206942 A | 12/2016 |
| CN | 106229409 A | 12/2016 |
| CN | 106299113 A | 1/2017 |
| CN | 104402220 B | 2/2017 |
| CN | 106374042 A | 2/2017 |
| CN | 106374043 A | 2/2017 |
| CN | 106374045 A | 2/2017 |
| CN | 106449972 A | 2/2017 |
| CN | 103898452 B | 3/2017 |
| CN | 106601908 A | 4/2017 |
| CN | 104576925 B | 5/2017 |
| CN | 106758163 A | 5/2017 |
| CN | 109563613 A | 4/2019 |
| JP | 2000-265262 A | 9/2000 |
| JP | 2001-342505 A | 12/2001 |
| JP | 2004-130541 A | 4/2004 |
| JP | 2005-023377 A | 1/2005 |
| JP | 2005-117031 A | 4/2005 |
| JP | 2006-245251 A | 9/2006 |
| JP | 2008-044626 A | 2/2008 |
| JP | 2009-249641 A | 10/2009 |
| JP | 2011-136120 A | 7/2011 |
| JP | 2014-033216 A | 2/2014 |
| JP | 2015-107899 A | 6/2015 |
| KR | 10-2008-0032043 A | 4/2008 |
| KR | 10-2012-0107018 A | 9/2012 |
| KR | 2012-0107018 A | 9/2012 |
| KR | 2014-0002901 U | 5/2014 |
| KR | 10-2016-0059159 A | 5/2016 |
| WO | 2007/008468 A1 | 1/2007 |
| WO | 2008/044626 A1 | 4/2008 |
| WO | 2011/136120 A1 | 11/2011 |
| WO | 2017/067314 A1 | 4/2017 |

OTHER PUBLICATIONS

Dhaidan, Nabeel S., et al. "Experimental and Numerical Investigation of Melting of NePCM Inside an Annular Container Under a Heat Flux Including the Effect of Eccentricity." International Journal of Heat and Mass Transfer, 67:455-468, 2013.

International Search Report and Written Opinion received for PCT Patent Application No. PCT/US2017/045895, dated Nov. 9, 2017, 10 pages.

Ke, Huizhen; et al. "Ag-Coated Polyurethane Fibers Membranes Absorbed With Quinary Fatty Acid Eutectics Solid-Liquid Phase Change Materials for Storage and Retrieval of Thermal Energy." Renewable Energy, 99:1-9, 2016.

Ke, Huizhen; et al. "Thermal Energy Storage and Retrieval Properties of Form-Stable Phase Change Nanofibrous Mats Based on Ternary Fatty Acid Eutectics/Polyacrylonitrile Composite by Magenetron Sputtering of Silver." J. Therm. Anal. Calorim., 123:1293-1307, 2016.

Parameshwaran, R., et al. "Preparation, Thermal and Rheological Properties of Hybrid Nanocomposite Phase Change Material for Thermal Energy Storage." Applied Energy, 115:320-330, 2014.

Weil, K.S., et al. "Brazing as a Means of Sealing Ceramic Membranes for Use in Advanced Coal Gasification Processes." Fuel, 85:156-162, 2006.

Yeo, Hong Goo; et al. "Efficient Piezoelectric Energy Harvesters Utilizing (001) Textured Bimorph PZT Films on Flexible Metal Foils." Advanced Functional Materials, 26:5940-5946, 2016.

\* cited by examiner

CHALCOGENIDE SPUTTERING TARGET AND METHOD OF MAKING THE SAME

REFERENCE TO RELATED APPLICATIONS

This application is a divisional application of U.S. patent application Ser. No. 15/670,487, filed Aug. 7, 2017, which claims priority to U.S. Provisional Patent Application Ser. No. 62/378,031, filed Aug. 22, 2016, the entire disclosures of which are expressly incorporated herein by reference.

TECHNICAL FIELD

The present invention relates to a sputtering target containing a chalcogenide. More specifically, the present invention relates to a sputtering target containing a primary matrix containing chalcogenide compounds or elements with one or more additional phases. Methods of making the same are also provided.

BACKGROUND

Physical vapor deposition ("PVD") methodologies are used extensively for forming thin films of material over a variety of substrates. In one PVD process, known as sputtering, atoms are ejected from the surface of a sputtering target by bombardment with gas ions, such as plasma. Thus, the sputtering target is the source of material which is deposited onto a substrate.

Phase change materials are emerging as promising materials for use in non-volatile memory devices. Phase change materials store information in their amorphous and crystalline phases, and can be rapidly reversibly changed by applying voltage to the material. Many phase change materials include at least one element from Group VI of the periodic table (i.e., chalcogenides) combined with one or more elements from Group IV or Group V of the periodic table. Often the elements of the phase change materials have disparate melting points and high vapor pressure. This poses challenges to manufacture phase change materials while maintaining high metal purity, low oxygen content, and desired compound stoichiometry. This is particularly true if the phase change material contains one or more elements with a high melting point.

Chalcogenide sputtering targets may be used in semiconductor memory applications to form thin films of chalcogenide materials on substrates. One current method of forming chalcogenide sputtering targets involves the consolidation of individual elemental powders to achieve the desired composition. This method tends to produce high oxygen levels. Additionally, density may suffer because of the limiting factor imposed by the lowest melting constituent. Another method for forming chalcogenide sputtering targets utilizes sealed quartz tubes as reactors to alloy and solidify the entire composition. This method is expensive and difficult to scale. Further, the resultant material tends to produce a porous sputtering target due to the formation of intermetallics which resist consolidation.

SUMMARY

In one embodiment, a physical vapor deposition device includes a phase change material sputtering target including a primary matrix and at least one additional phase substantially homogenously dispersed in the primary matrix. The primary matrix includes at least one element from Group VI of the periodic table excluding oxygen and one or more elements from Group IV or Group V of the periodic table. Suitable additional phases can be compounds or elemental materials.

Methods of making a phase change material sputtering target are also provided. While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
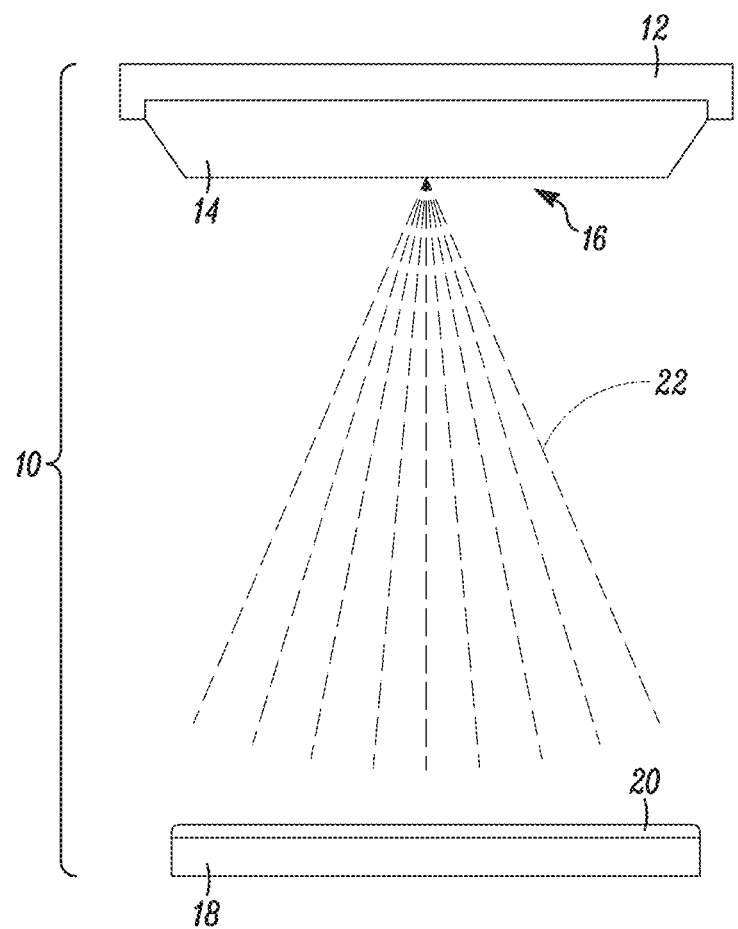
FIG. 1 is a diagrammatic view of a portion of an exemplary physical vapor deposition apparatus.

The current disclosure relates to phase change material sputtering targets and methods of making the same. A diagrammatic view of a portion of an exemplary physical vapor deposition apparatus 10 is shown in FIG. 1. A physical vapor deposition ("PVD") apparatus 10 comprises a backing plate 12 having a sputtering target 14 bonded thereto, such as with an epoxy bond, an indium bond, or other types of solder bonds. A semiconductive material wafer 18 is within the apparatus 10 and provided to be spaced from the target 14. Surface 16 of sputtering target 14 is a sputtering surface. In operation, sputtered material 22 is displaced from sputtering surface 16 of sputtering target 14 and forms a coating (or thin film) 20 over wafer 18. In some embodiments, sputtering target 14 may be used in the PVD apparatus 10 without backing plate 12. This configuration is referred to as a monolithic configuration.

In some embodiments, sputtering target 14 is a phase change sputtering target formed from an alloy compound containing a primary alloy material and at least one additional phase. The primary alloy material includes at least one element from Group VI of the periodic table (i.e., chalcogenide) and one or more elements from Group IV or Group V of the periodic table. Suitable elements from Group VI include sulfur (S), selenium (Se), tellurium (Te) and polonium (Po). Suitable elements from Group IV and V include germanium (Ge), arsenic (As), tin (Sn) and antimony (Sb). The primary alloy material can exhibit a glass transition behavior in some embodiments.

The sputtering target 14 includes at least one additional phase. The additional phase may be a compound or an elemental material. Suitable additional phases can be compounds such as GeSe or elements such as silicon (Si). In some embodiments, the sputtering target 14 can include an additional phase and an additional elemental material. For example, the sputtering target 14 can include Si and GeSe. In some embodiments, sputtering target 14 may consist or consist essentially of selenium, germanium, arsenic, and silicon or may consist or consist essentially of germanium, arsenic, tellurium, and silicon, where such listing do not indicate empirical ratios of the elements. Trace impurities may also be present.

In some embodiments, the Group VI element(s) may be represent in the major constituents of the alloy compound. For example, the Group VI element(s) may be present in amount from about 45 wt % to about 80 wt % by weight of the alloy compound. In some embodiments, each element from Group IV or V may be present in amounts from about 5 wt % to about 50 wt % of the alloy compound. The alloy compounds may range from binary to quinary compounds. In some embodiments, the alloy compounds may contain more than five components (i.e., may be of a higher order than a quaternary compound). Exemplary composition ranges of alloy compounds for sputtering target 14 are provided in Table 1.

TABLE 1

Exemplarily Compositions

| | Ge (wt %) | As (wt %) | Te (wt %) | Se (wt %) | Si (wt %) |
|---|---|---|---|---|---|
| Example 1 | 5-15 | 20-40 | — | 45-65 | 0-10 |
| Example 2 | 5-20 | 20-40 | 45-65 | — | 0-10 |
| Example 3 | 20-50 | 0-20 | 0-25 | 45-80 | 0-10 |

In some embodiments, the alloy compound may be comprised of a bulk or primary matrix that may be a single phase or near single phase alloy. The bulk matrix may contain one or more homogeneously or substantially homogeneously distributed additional phases.

In some embodiments, the homogeneous characterization of the additional phase(s) is indicated by a homogenous or substantially homogenous elemental composition. For example, in some embodiments, FEI measurements taken across the sputtering surface of the sputtering target 14 indicate less than 1% variation in atomic elemental composition. For example, samples from the center, mid-radius, and edge of the target blank indicate less than 1% variation in atomic elemental composition. In some embodiments, a sputtering target having a substantially homogeneous distribution of additional phases is characterized by collecting the phase size and count across a sample. The sum of the phases is uniform within less than 10% relative deviation center-to-edge and the individual phases are uniform within less than 10% relative deviation center-to-edge. In some embodiments, the average size of the phases is uniform within less than 5% relative deviation center-to-edge. An example sputtering target having substantially homogenously distributed additional phases is provided in Table 2.

microns to less than 10 microns, such as to about 1 micron. In some embodiments, one or more of the additional phases may have a mean size of less than about 40 microns, such as from about 40 microns to about 1 micron.

The mean equivalent diameter of an additional phase in the form of an elemental material may be adjusted using a common reduction method, including crushing, grinding, ball mill, and jet mill before incorporation into the bulk matrix. The particles may be sieved through Standard Tyler Sieves or another means to achieve a desired mean diameter or size distribution. In some embodiments, a silicon second phase may have a mean diameter or size of approximately 40 microns to less than 10 microns. The use of ultrafine manufactured powder may achieve extremely fine dispersals of any secondary phase.

Sputtering target 14 may have low oxygen content. One suitable method for determining oxygen content is by gas chromatography. In some embodiments, the oxygen content may less than 2000 parts per million (ppm), less than 1000 ppm, less than 300 ppm or less than 100 ppm. In some embodiments, the oxygen content may be about 2000 ppm to about 5 ppm, or about 1000 ppm to about 5 pm, or about 300 ppm to about 5 ppm, or about 5 ppm to about 100 ppm.

Sputtering target 14 may have high purity. Suitable methods for determining purity include inductively coupled plasma optical emission spectrometry (ICP-OES) and glow discharge mass spectrometry (GDMS). In some embodiments, sputtering target 14 may meet 4N purity or 99.99% purity. In further embodiments, sputtering target 14 may meet 4N5 purity or 99.995% purity. In some embodiments, sputtering target 14 can have a purity of at least 99.999%.

In some embodiments, sputtering target 14 may have a density of at least 90% of theoretical density or of at least 95% of theoretical density. For example, in some embodiments, sputtering target 14 may have a density of 98% of theoretical density or greater. In some embodiments, sputtering target 14 may be fully dense. That is, sputtering target 14 may be free of pores, spaces and voids. A gross indication of porosity may be the observance of bubbles during an Archimedes density measurement. Another method of determining porosity involves cross sectional sampling of the chalcogenide alloy material. A fully dense material will be free of voids. Chalcogenide alloy materials do not have published density values. While the Method of Mixtures supplies a rough estimate, the presence of multiple alloy or elemental phases as well as varying solid states makes estimation of density difficult. Furthermore, areas around hard phase constituents with angular surfaces, such as an additional phase (i.e. silicon), are difficult to fill in these composite materials. In some embodiments, sputtering target 14 may be free of voids or spaces, including free of voids

TABLE 2

| Sample location | Area Scanned (mm 2) | Particles of interest in area | Particles of interest per mm 2 | Si count | Si particles per mm 2 | Si avg size | Si—Te count | Si—Te per mm 2 | Si—Te avg size |
|---|---|---|---|---|---|---|---|---|---|
| Center | 0.478 | 956 | 2000 | 319 | 667 | 16.9 | 637 | 1333 | 7.88 |
| Mid-radial | 0.472 | 953 | 2019 | 325 | 689 | 17.74 | 628 | 1331 | 8.35 |
| Edge | 0.421 | 954 | 2266 | 335 | 796 | 17.39 | 619 | 1470 | 7.97 |
| Average | | | 2095 | 326 | 717 | 17.34 | 628 | 1378 | 8.07 |
| Standard Deviation | | | 148 | 8.08 | 68.81 | 0.42 | 9 | 80 | 0.25 |
| Relative Deviation | | | 7.08% | 2.48% | 9.59% | 2.43% | 1.43% | 5.81% | 3.09% |

In some embodiments, one or more of the additional phases may have a mean diameter or size of about 200 or spaces between the bulk matrix and the additional phase(s). SEM imaging can be used to detect voids or spaces between the bulk matrix and the additional phase(s). The process methodology developed completely fills these gaps.

Figure 8:
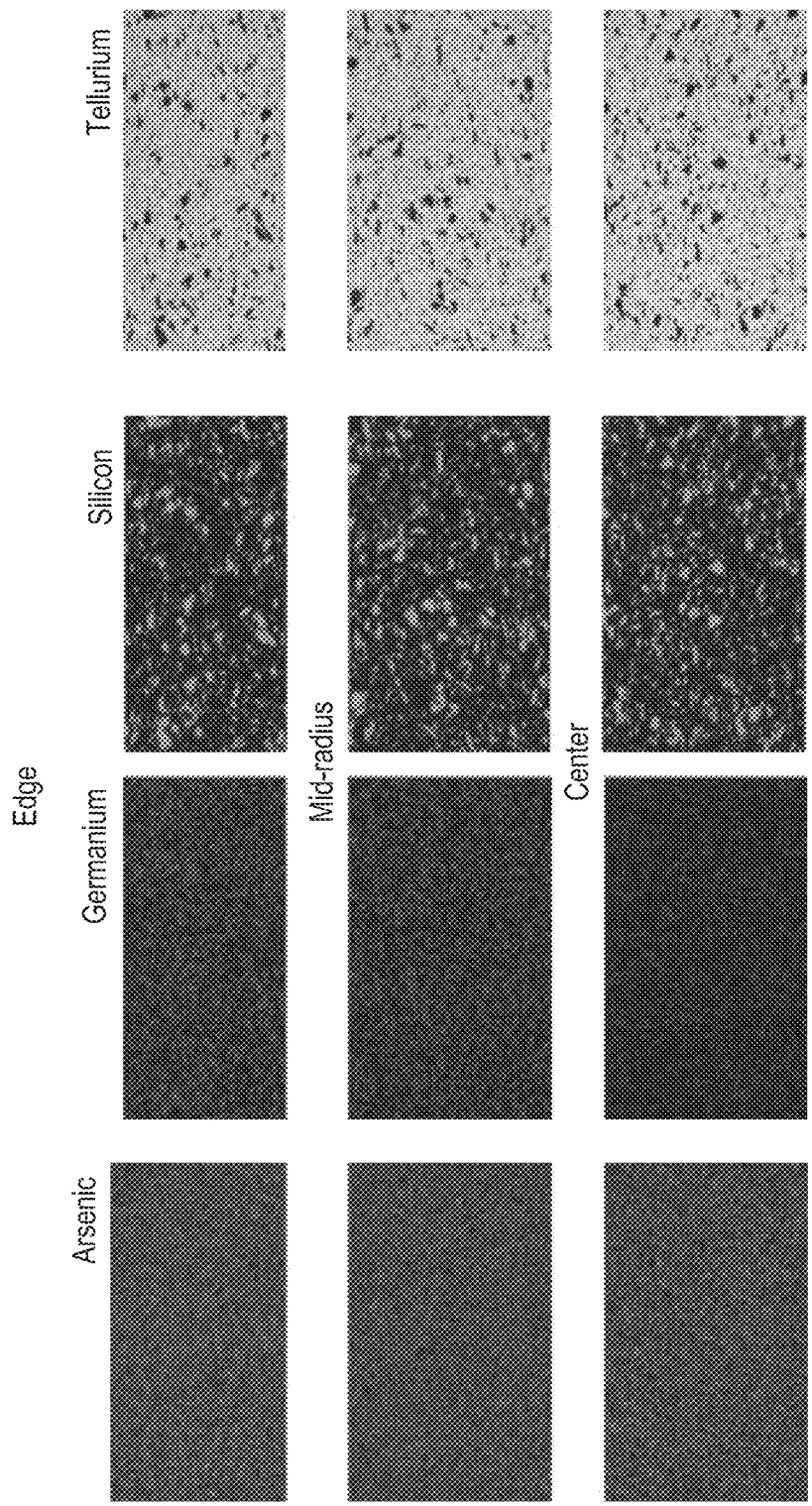
FIG. 8 is images from energy dispersive x-ray (EDS) for Example 2.

Sputtering target 14 may have a substantially consistent or homogenous elemental distribution across the sputtering surface. For example, samples taken at the edge, mid-radius and center of the sputtering surface may have substantially the same elemental distribution. Suitable methods for determining elemental distribution include FEI mapping utilizing energy dispersive x-ray (EDS) of cross sections. In some embodiments, FEI mapping may indicate less than 1% variation in atomic elemental composition from center to mid-radius to edge of the target sputtering target 14. Another suitable method involves analyzing a series of samples using ICP-OES to track major constituents at various locations. FIG. 8 illustrates EDS mapping across the radius of a quaternary alloy target blank. The elements are equally dispersed throughout each sample and across the blank.

Sputtering target 14 may be formed by synthesizing a primary alloy, which is then reduced to powder and blended with at least one second alloy powder or elemental powder to form a powder mixture. The powder mixture is vacuum hot pressed to densify and form a sputtering target.

The primary alloy may be formed by melting components with favorable binary or ternary phases in a crucible. In some embodiments, the primary alloy is a binary alloy having a first component selected from Group VI of the periodic table (excluding oxygen) and the second component selected from Group IV or Group V of the periodic table. Many chalcogenides contain either selenium or arsenic, elements with relatively low melting points and high vapor pressure. Care must be taken to choose compositions that minimize yield loss and maintain nominal composition. The alloy may be formed in an inert atmosphere to reduce oxidation.

In some embodiments, the primary alloy may be a ternary alloy formed by adding a third component to the molten binary alloy. In some embodiments, the temperature at which the molten binary alloy is maintained may be reduced before the third component is added to minimize loss of the third component. In some embodiments a third component and one or more additional components are added to the molten binary alloy. The temperature at which the molten binary alloy is maintained may be reduced before the addition of the component.

The molten primary alloy may be poured into a mold. In some embodiments, the primary alloy rapidly solidifies to form a homogenous or at least substantially homogenous, amorphous, glassy billet.

A second alloy powder may be formed using a process similar to the primary alloy powder. The second alloy may exhibit glass-like characteristics similar to the primary alloy or may be a harder material that will be encapsulated by the primary alloy during consolidation. The second alloy powder is reduced to a powder before blending with the primary alloy powder. Additional alloys powder may also be formed in a similar process.

One or more elemental powders may also be added to the powder mixture. For example, silicon shot may be added to the powder mixture. In some embodiments, the shot may be reduced in mean particle size prior to adding the elemental powder to the powder mixture.

The primary alloy and at least one additional alloy powder (such as the second alloy powder) or elemental powder are blended to achieve the desired stoichiometry. That is, the powder mixture includes the primary alloy powder and one or more additional alloy powders and/or elemental powders. In some embodiments, the elemental powders may be produced physically from bulk material to achieve a desired particle size or may be purchased as powders of predetermined particle size. In some embodiments, the powder mixture is formed by mixing a ternary alloy in powder form with silicon powder. The elemental powders tend to be high melting materials that raise the liquidus to temperatures that would vaporize lower melting components.

The powder mixture is loaded into a vacuum hot press for consolidation and formation of the sputtering target blank. In some embodiments, silicon may be reduced in form factor shortly before it is blended in the powder mixture. For example, silicon in the form of shot may be reduced to a powder. In some embodiments, the initial silicon shot may have an average diameter of 5 mm and may be reduced to silicon powder having a Tyler Equivalent Mesh size of at least −140 M. It has been found that reducing the silicon form factor shortly before it is blended with the powder mixture reduces the oxygen content of the sputtering target.

The powder blend may be hot pressed at the glass transition temperature of the primary alloy. The glass transition temperature is the temperature range over which a material transitions from a solid or hard state to a flowable or viscous state. If the temperature of the hot press is too low, the sputtering target will be less dense. If the temperature of the hot press is too high, the material may squeeze out of the die set. The correct balance of temperature and pressure produces a high density chalcogenide target blank.

When vacuum hot pressed at the glass transition temperature, the primary alloy flows around harder components to form a dense sputtering target blank. Additional components may either be another chalcogenide glass that softens or a hard alloy. Remaining additions may be elemental (i.e. silicon) to complete the desired composition. As described herein, the sputtering target may have a density of at least 95% of theoretical density, and in some embodiments may be completely densified with no observable porosity.

The sputtering target blank may be subjected to additional surface treatments and/or machining after the vacuum hot press. For example, the surface of the sputtering target blank may be cleaned. In some embodiments, the sputtering target blank is processed to form a sputtering target which may be bonded to a backing plate. For example, the sputtering target may be bonded to a backing plate by an epoxy, indium bond, or other type of solder bond.

Example 1—SeAsGeSi Sputtering Target

A sputtering target blank was formed of selenium, germanium, arsenic, and silicon. A binary alloy was created by combining and heating arsenic and selenium in a crucible in an inert atmosphere. The molten primary alloy was cast and cooled.

A second binary alloy was created by combining and heating selenium and germanium in a crucible in an inert atmosphere. The molten second binary alloy was cast and cooled.

Figure 2:
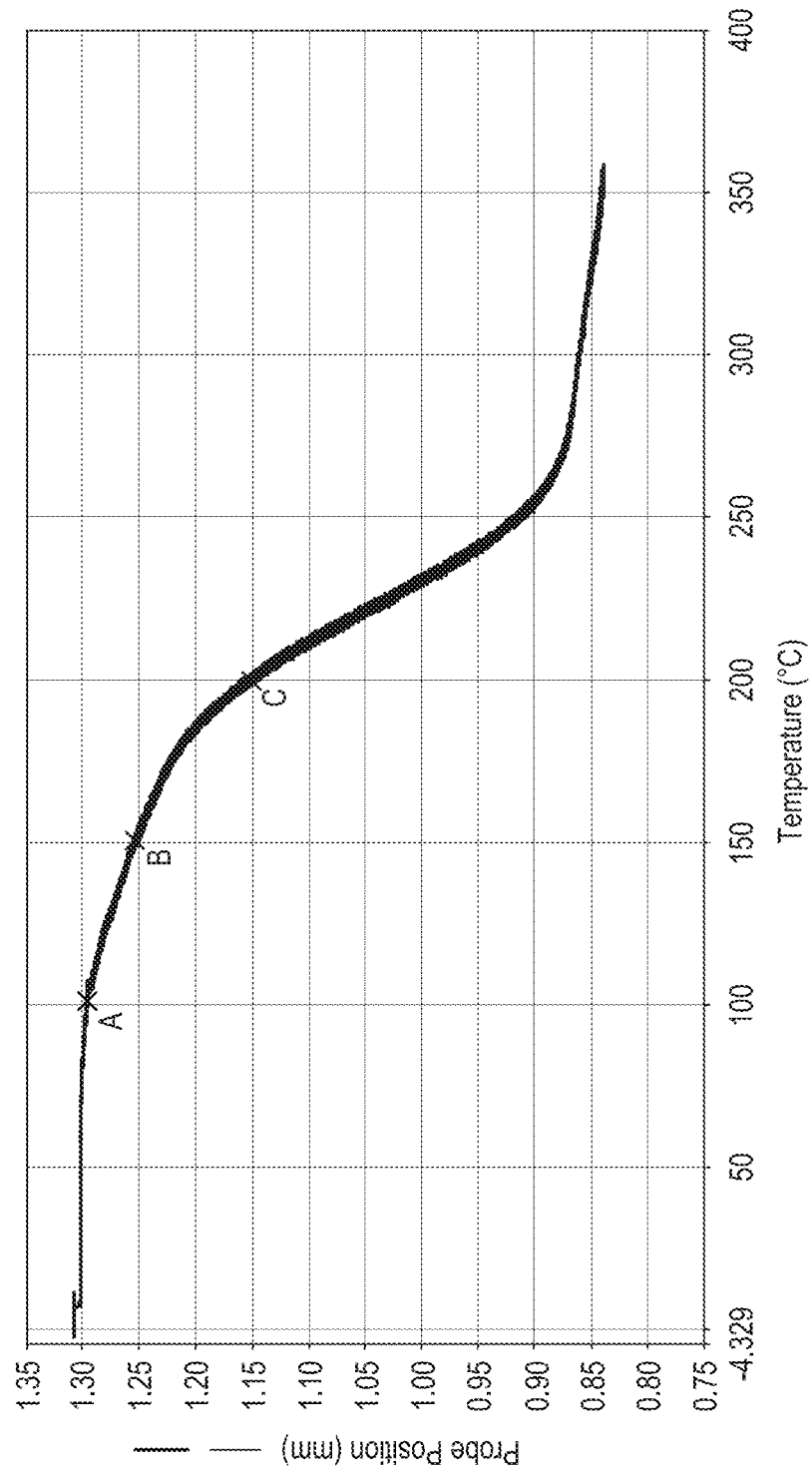
FIG. 2 is a graph of temperature versus probe position for an exemplary GeSeAs material.

The primary and secondary alloys are glasses. Thermal analysis was used to determine the glass transition temperatures. The primary and secondary alloys were reduced in form factor. Silicon shot was reduced in form factor to suitable particle size to combine with the reduced form factor primary and secondary alloys. The mixture was vacuum hot pressed at conditions portrayed in FIG. 2.

In Trial 1, the SeAsGeSi material was vacuum hot pressed at the temperature of point A. The resulting sputtering target was about 74% dense and crumbled. The resulting sputtering target was not suitable.

In Trial 2, the SeAsGeSi material was vacuum hot pressed at the temperature of point B. Negligible squeeze out was observed during hot pressing. The resulting sputtering was greater than 99% dense.

In Trial 3, the SeAsGeSi material was vacuum hot pressed at the temperature of point C. Negligible squeeze out was observed during hot pressing. The resulting sputtering target had a density of 100%.

size ("Avg"), standard deviation in particle size ("StdDev"), median particle size ("Median"), minimum particle size ("Min"), maximum particle size ("Max") and the particle count by particle size range ("particle count") are provided. Particle count is the number of particles falling within a particle size range in which Grp1 has a size of 1.00-3.10 µm, Grp2 has a size of 3.10-9.61 µm, Grp 3 has a size of 9.61-29.79 µm, and Grp 4 has a size of 29.79-92.35 µm).

TABLE 2

Silicon Particle Size Distribution for Several Trials

| Sample | Total particles | Average | StdDev | Median | Min | Max | Particle count ||||
|---|---|---|---|---|---|---|---|---|---|---|
| | | | | | | | Grp1 | Grp2 | 3Grp | Grp4 |
| Lot #357 | 453 | 7.88 | 3.72 | 7.30 | 1.72 | 28.54 | 32 | 312 | 109 | 0 |
| Lot #372 | 404 | 14.15 | 7.64 | 12.72 | 1.58 | 50.23 | 6 | 131 | 252 | 15 |
| Lot #362 | 232 | 19.43 | 7.51 | 19.15 | 4.38 | 48.76 | 0 | 22 | 190 | 20 |
| Lot #361 | 356 | 39.59 | 17.15 | 36.89 | 5.75 | 110.94 | 0 | 6 | 109 | 238 |

Figure 4:
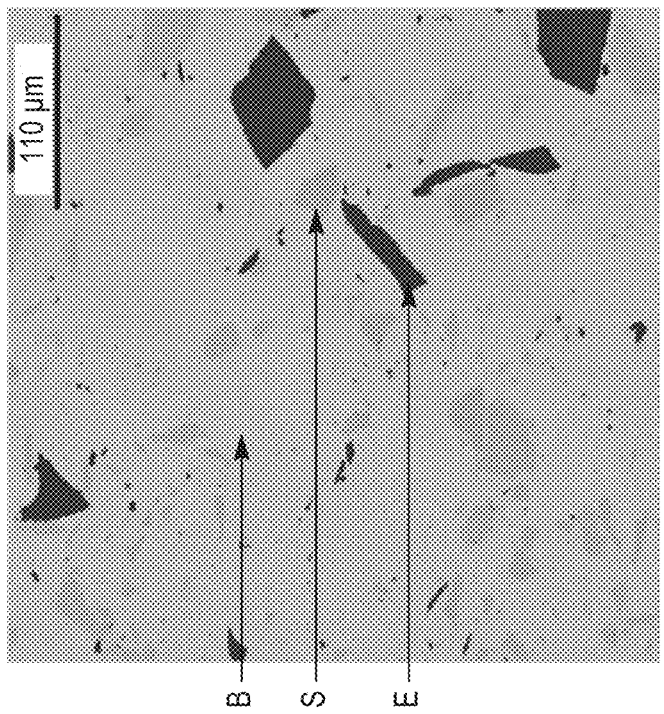
FIGS. 3 and 4 are scanning electron microscopy images for Example 1.
Figure 3:
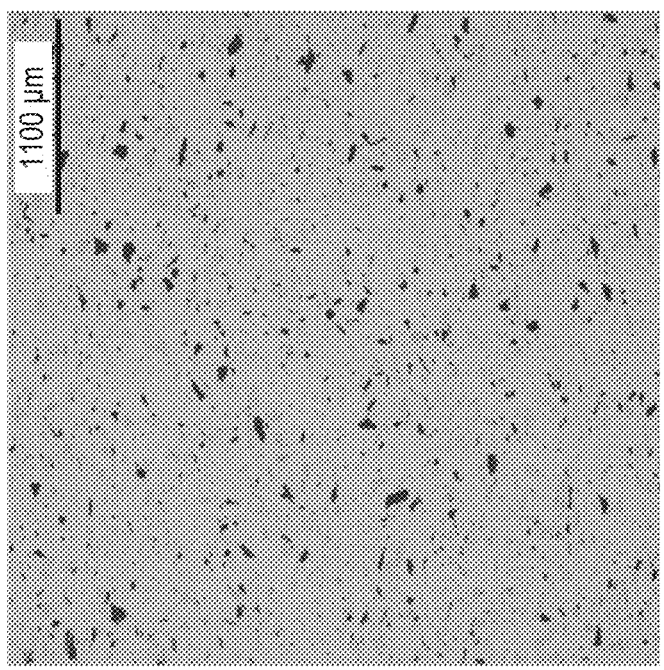

FIGS. 3 and 4 are scanning electron microscopy images of the consolidated SeAsGeSi compound. Three regions are evident in FIG. 4. More specifically, the elemental phase (i.e., silicon) is the dark areas indicated by "E", the bulk phase (i.e., SeAs) is the primary lighter areas indicated by "B" phase, and the additional phase (i.e., GeSe) is the secondary darker areas indicated by "S" in FIG. 4. The sample in FIG. 3 is substantially SeAs with a homogeneous mixture of GeSe and silicon interspersed. There is no evidence of voids.

Silicon has a melting point of 1410° C., which is higher than the boiling point of selenium and arsenic. In particular, the high temperature required to dissolve silicon can drive off selenium and arsenic as highly toxic vapors. In Example 1, the creation of first and second binary alloys result in less vaporization of selenium and arsenic. The creation of a combination of lower melting chalcogenide alloys preserves the integrity of the selenium and arsenic content while enabling densification.

Examples 2 and 3—GeAsTeSi Sputtering Target

A sputtering target was formed of germanium, arsenic, tellurium, and silicon. A ternary alloy was created by combining and heating germanium, tellurium, and arsenic in a crucible in an inert atmosphere. The raw material form factor is adjusted to provide the most favorable casting condition.

The temperature of the crucible was maintained in a region between the solidus and liquidus for this particular alloy to suppress arsenic volatilization. The molten alloy is poured into a graphite mold. Rapid solidification minimizes segregation of potential phases within the ternary alloy system.

Figure 6:
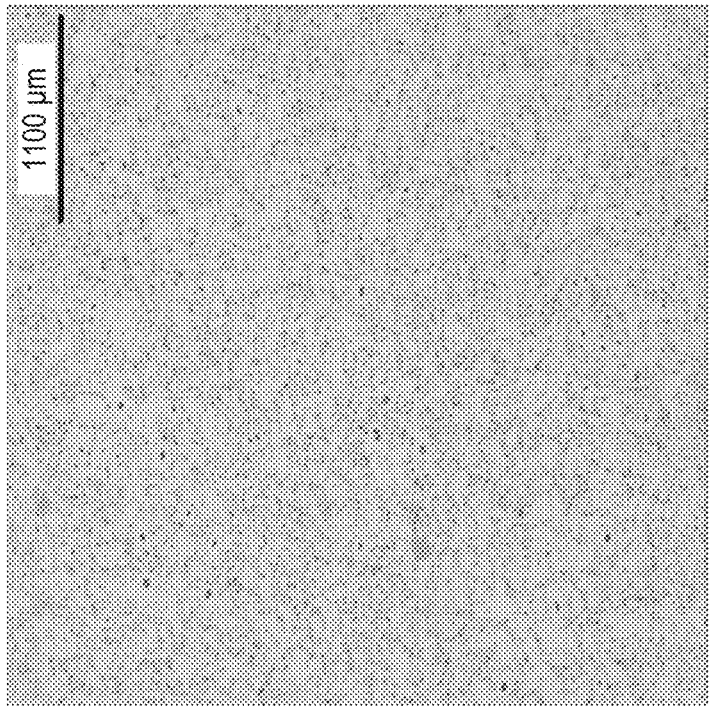
FIGS. 5 and 6 are scanning electron microscopy images for Example 2.
Figure 5:
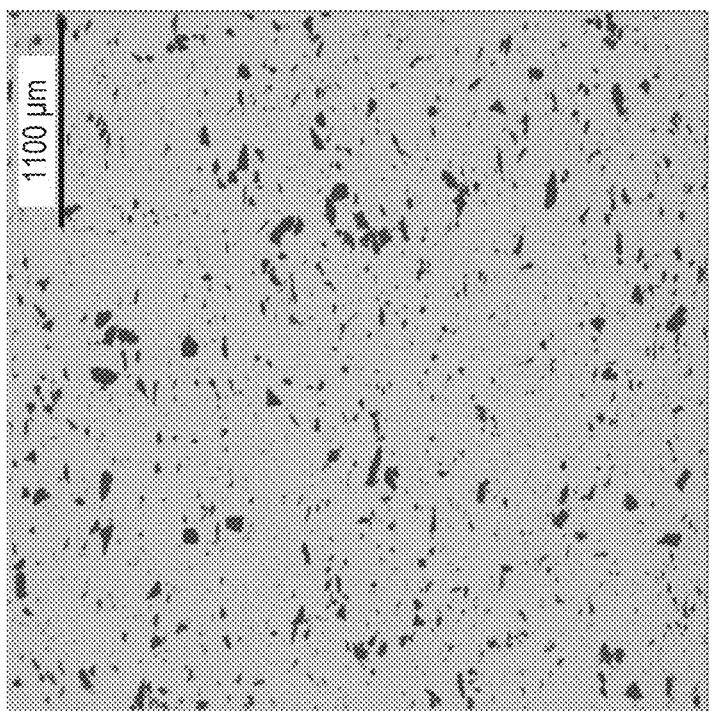

The ternary alloy was combined with silicon and the powder mixture was vacuum hot pressed. The ternary alloy was reduced in form factor to Tyler Equivalent Mesh Size of −100M shortly before combination. In Example 2, the silicon was reduced from shot to Tyler Equivalent Mesh Size of −140M (about 40 µm mean size) shortly before combination. In Example 3 a fine silicon powder (about 8 µm mean size) was used. Table 2 illustrates silicon particle size distributions for several trials in which the average particle FIGS. 5 and 6 are images from a scanning electron microscopy of the resulting sputtering target blanks of Example 2 and Example 3, respectively. As shown, the GeAsTe alloy was near single phase. The silicon second phase is substantially homogeneously dispersed with a mean diameter of 38 and 8 microns, respectively. There is no evidence of porosity.

Figure 7:
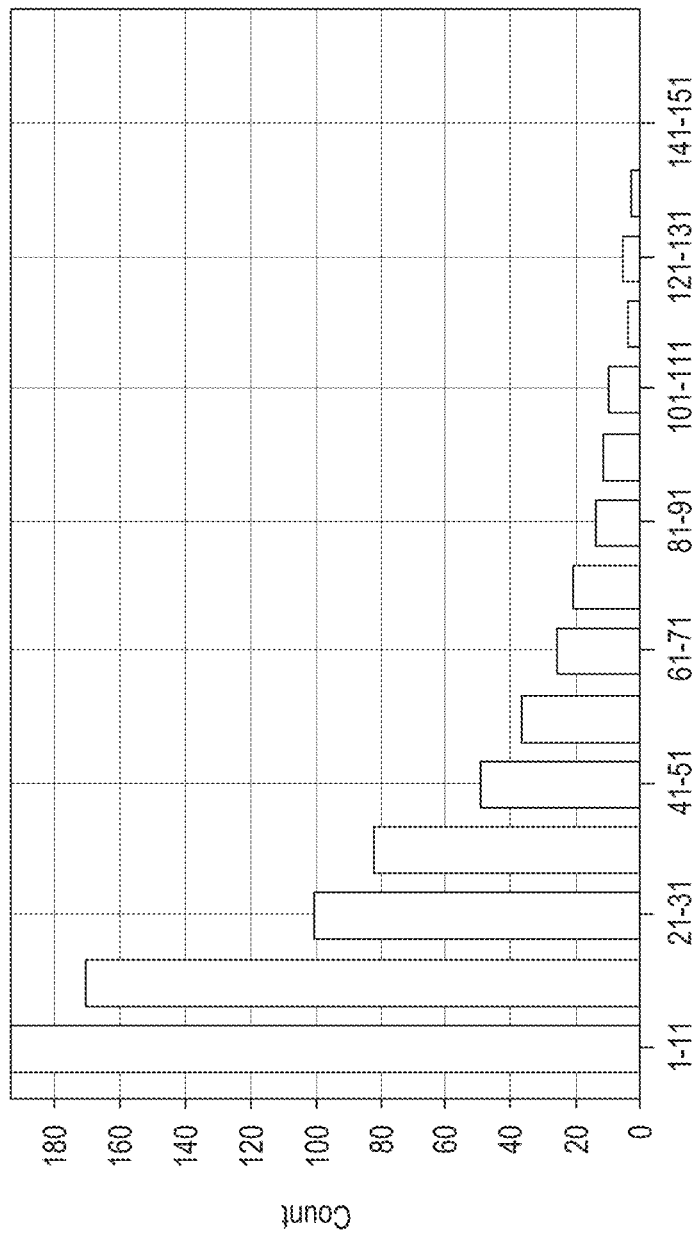
FIG. 7 is a mean size distribution graph for Example 2.

FEI was used to measure the silicon size distribution of Example 2 and a distribution plot is provided in FIG. 7. The total number of particles analyzed was 730. The particles had a mean size range between 2 microns and 174 microns with a mean size of 31 microns and a standard deviation of 27.5. The majority of the particles having a mean size of less than 100 microns.

An FEI Map of Example 2 is provided in FIG. 8. Samples were cross-sectioned from areas corresponding to the edge, mid-radius and center of the target blank. The distribution of each component at each location is substantially homogenous.

Oxidation is affected by the ambient environment, the reactivity of the material, time, and the surface area of individual components. In one embodiment, IGA revealed an increase of oxygen level from 34 ppm to 82 ppm when the silicon particle size was reduced prior to consolidation from −140M to −325M, respectively.

Example 4—GeAsSeTe Sputtering Target

A sputtering target was formed of germanium, arsenic, selenium, and tellurium. Binary alloys were created by combining and heating germanium and tellurium, and separately selenium and arsenic in crucibles in an inert atmosphere. The raw material form factor is adjusted to provide the most favorable casting condition.

The temperature of the crucible was maintained in a region between the solidus and liquidus for the SeAs alloy to suppress volatilization. The molten alloy is poured into a graphite mold. Rapid solidification minimizes segregation of potential phases within the binary alloy system.

The temperature of the crucible was maintained in a region between the solidus and liquidus for the GeTe alloy to suppress volatilization. The molten alloy is removed from a graphite mold.

The two binary alloys are reduced to powder and mixed in a ratio to achieve the desired final stoichiometry. The powder mixture was vacuum hot pressed. The primary alloy (SeAs) and secondary alloy (GeTe) were reduced in form factor to Tyler Equivalent Mesh Size of −140M shortly before combination.

Figure 9:
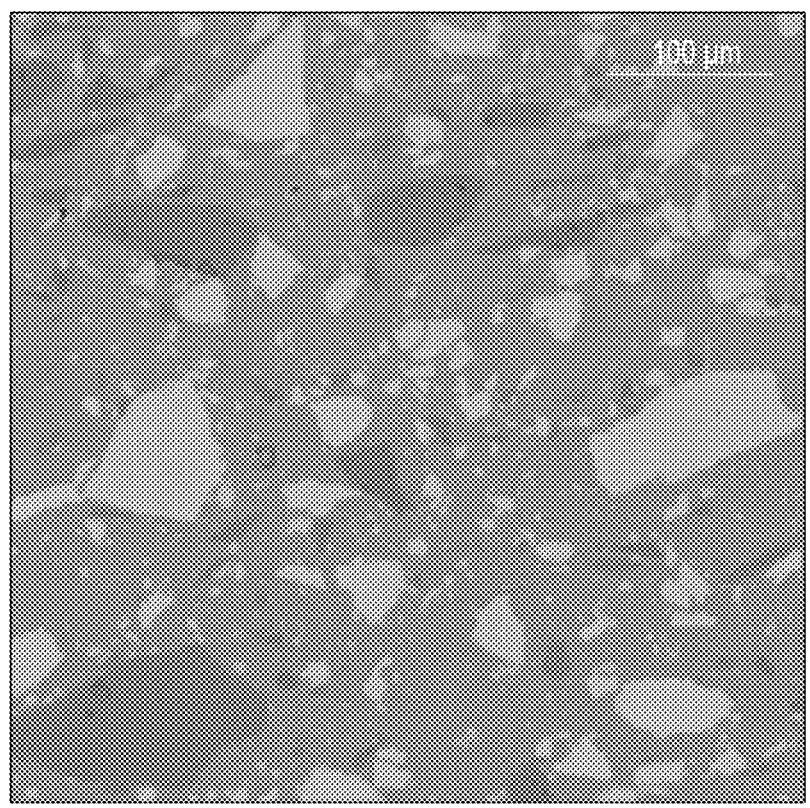
FIG. 9 is a scanning electron microscopy image for Example 4.

FIG. 9 is an image from a scanning electron microscopy of the resulting sputtering target blank of Example 4. The bulk matrix was comprised of a primary phase SeAs. As shown, the SeAs alloy was near single phase. The second phase is the lighter areas and is GeTe compound. The GeTe second phase is substantially homogeneously dispersed throughout the sample. Some elemental germanium is present and is the dark areas. There is no evidence of porosity.

Oxidation is affected by the ambient environment, the reactivity of the material, time, and the surface area of individual components. In this embodiment, IGA revealed an oxygen level of 190 ppm.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

What is claimed is:

1. A method of forming a phase change material sputtering target, the method comprising:
    forming a primary alloy including at least one element from Group VI of the periodic table excluding oxygen and at least one element from Group IV or Group V of the periodic table;
    reducing the primary alloy to form an primary alloy powder;
    forming a second alloy including at least one element from Group VI of the periodic table excluding oxygen and at least one element from Group IV or Group V of the periodic table;
    reducing the second alloy to form a second alloy powder;
    forming a powder mixture by blending the primary alloy powder, the second alloy powder and optionally one or more additional powder components; and
    hot pressing the powder mixture to form a sputtering target.

2. The method of claim 1 wherein the additional powder component is an alloy powder.

3. The method of claim 1 wherein the additional powder component is an elemental powder.

4. The method of claim 1 wherein the second alloy has a higher hardness than the primary alloy.

5. A method of forming a phase change material sputtering target, the method comprising:
    forming a primary alloy including at least one element from Group VI of the periodic table excluding oxygen and at least one element from Group IV or Group V of the periodic table, wherein forming the primary alloy comprises:
        forming a molten binary alloy;
        reducing the temperature of the molten binary alloy; and
        adding a third component to the molten binary alloy to form a ternary alloy;
    reducing the primary alloy to form an alloy powder;
    forming a powder mixture by blending the alloy powder with an additional powder component; and
    hot pressing the powder mixture to form a sputtering target.

6. The method of claim 5 wherein the powder mixture is hot pressed at the glass transition temperature of the primary alloy.

7. The method of claim 5 wherein the additional powder component has a mean size of less than about 40 µm.

8. A method of forming a phase change material sputtering target, the method comprising:
    forming a primary alloy including at least one element from Group VI of the periodic table excluding oxygen and at least one element from Group IV or Group V of the periodic table;
    reducing the primary alloy to form a primary alloy powder;
    forming a second alloy including at least one element from Group VI of the periodic table excluding oxygen and at least one element from Group IV or Group V of the periodic table;
    reducing the second alloy to form a second alloy powder;
    forming a powder mixture by blending the primary alloy powder the second alloy powder and optionally one or more additional powder components; and
    hot pressing the powder mixture at the glass transition temperature of the primary alloy to form a sputtering target.

9. The method of claim 8 wherein the one or more additional powder components is an alloy powder.

10. The method of claim 9 wherein the additional powder component is an elemental powder.

11. The method of claim 8 wherein the second alloy has a higher hardness than the primary alloy.

12. The method of claim 8 wherein forming the primary alloy comprises forming a molten binary alloy;
    reducing the temperature of the molten binary alloy; and
    adding a third component to the molten binary alloy to form a ternary alloy.

13. The method of claim 8 wherein the one or more additional powder components has a mean size of less than about 40 µm.

14. The method of claim 1 wherein the one or more additional powder components has a mean size of less than about 40 µm.

15. The method of claim 1 wherein the second alloy has a higher hardness than the primary alloy.

16. The method of claim 1 wherein the at least one element from Group VI of the periodic table excluding oxygen in the primary alloy includes selenium (Se) or tellurium (Te).

17. The method of claim 1 wherein the at least one element from Group IV or Group V of the periodic table in the primary alloy includes germanium (Ge) or arsenic (As).

18. The method of claim 5 wherein the at least one element from Group VI of the periodic table excluding oxygen in the primary alloy includes selenium (Se) or tellurium (Te).

19. The method of claim 5 wherein the at least one element from Group IV or Group V of the periodic table includes germanium (Ge) or arsenic (As).

20. The method of claim 8 wherein the at least one element from Group VI of the periodic table excluding oxygen in the primary alloy includes selenium (Se) or tellurium (Te).

* * * * *